United States Patent [19]

Takeshita et al.

[11] Patent Number: 4,940,217
[45] Date of Patent: Jul. 10, 1990

[54] LEAD FRAME CONVEYING APPARATUS

[75] Inventors: Osamu Takeshita; Takayuki Iwai; Kenichi Terauchi, all of Kyoto, Japan

[73] Assignee: Dainippon Screen Mfg. Co., Ltd., Japan

[21] Appl. No.: 294,373

[22] Filed: Jan. 6, 1989

[30] Foreign Application Priority Data

Jan. 6, 1988 [JP] Japan ................................ 63-839

[51] Int. Cl.$^5$ ................................ B23Q 1/06
[52] U.S. Cl. ................................ 269/50; 269/52
[58] Field of Search ............... 269/20, 21, 13, 14, 269/50–52, 73, 903, 309, 310; 279/1 L; 29/271, 559; 414/676, 749 R, 749, 750; 198/375, 376, 972

[56] References Cited

U.S. PATENT DOCUMENTS

| 3,906,607 | 9/1975 | Gusev | 269/52 |
| 4,390,172 | 6/1983 | Gotman | 269/309 |
| 4,444,541 | 4/1984 | Bergman | 269/309 |
| 4,516,318 | 5/1985 | Kirschenman | 269/51 |
| 4,567,938 | 2/1986 | Turner | 269/903 |
| 4,586,702 | 5/1986 | Chambers | 269/310 |
| 4,700,488 | 10/1987 | Curti | 269/50 |
| 4,729,551 | 3/1988 | Glessner et al. | 269/903 |

Primary Examiner—Robert C. Watson
Attorney, Agent, or Firm—Ostroelenk, Faber, Gerb & Soffen

[57] ABSTRACT

An improved lead frame conveying apparatus for conveying a lead frame to a bonding position has two pins each with a tapered end which is provided for being inserted into a positioning hole in a lead frame. The tapered end has an upper portion the diameter of which is smaller than the diameter of the positioning hole in the lead frame and a lower portion the diameter of which is larger than the diameter of the positioning hole. The lead frame is supported by the tapered ends of the pins which engage the round edges of the positioning holes. The tapered pins are moved controllably in this state, thereby feeding the lead frame to the bonding position. Since the weight of lead frame tends to push the lead frame down on the pins, the centers of the positioining holes and the tapered pins become automatically aligned, bringing about correct aligning of the lead frame.

24 Claims, 15 Drawing Sheets

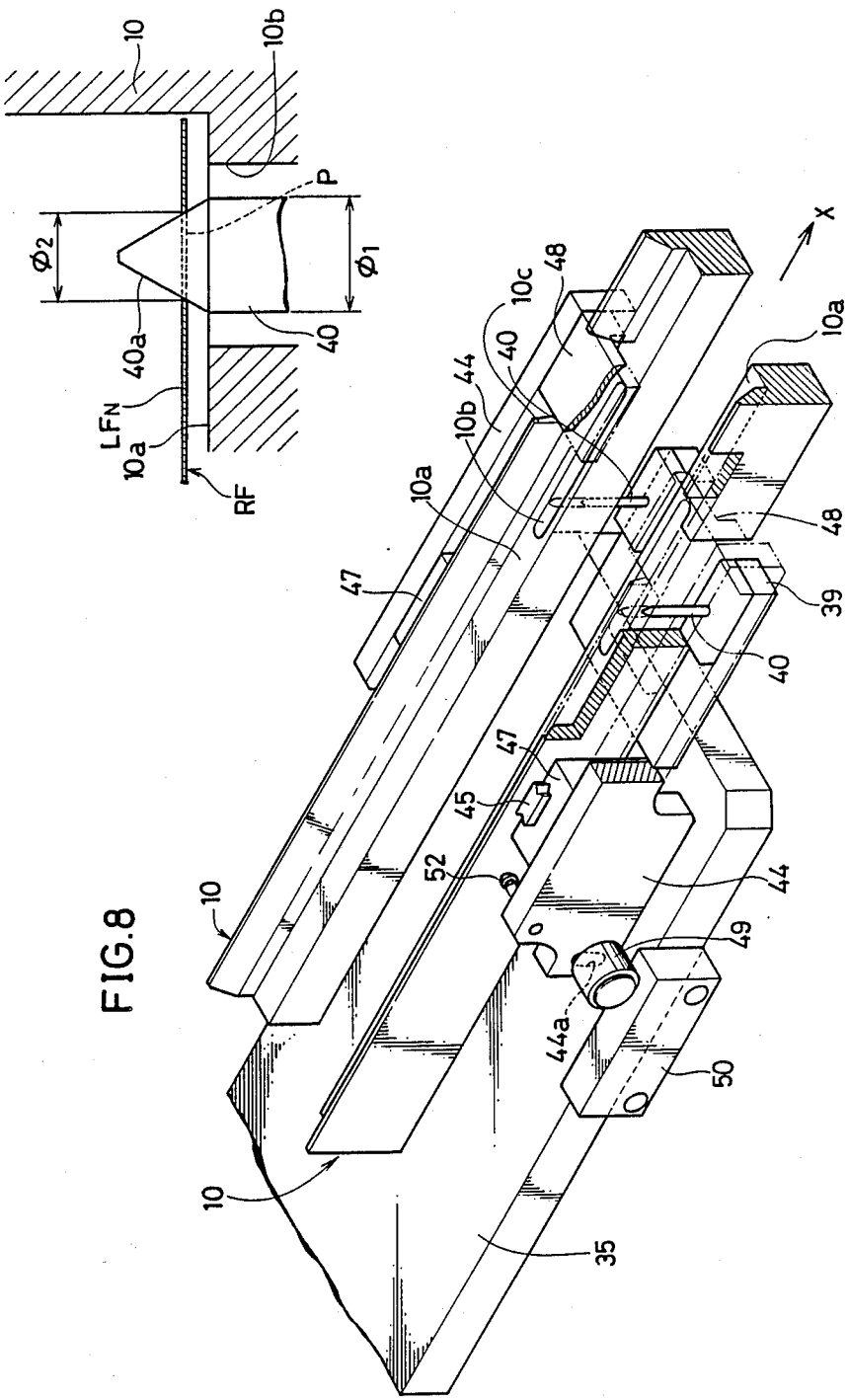

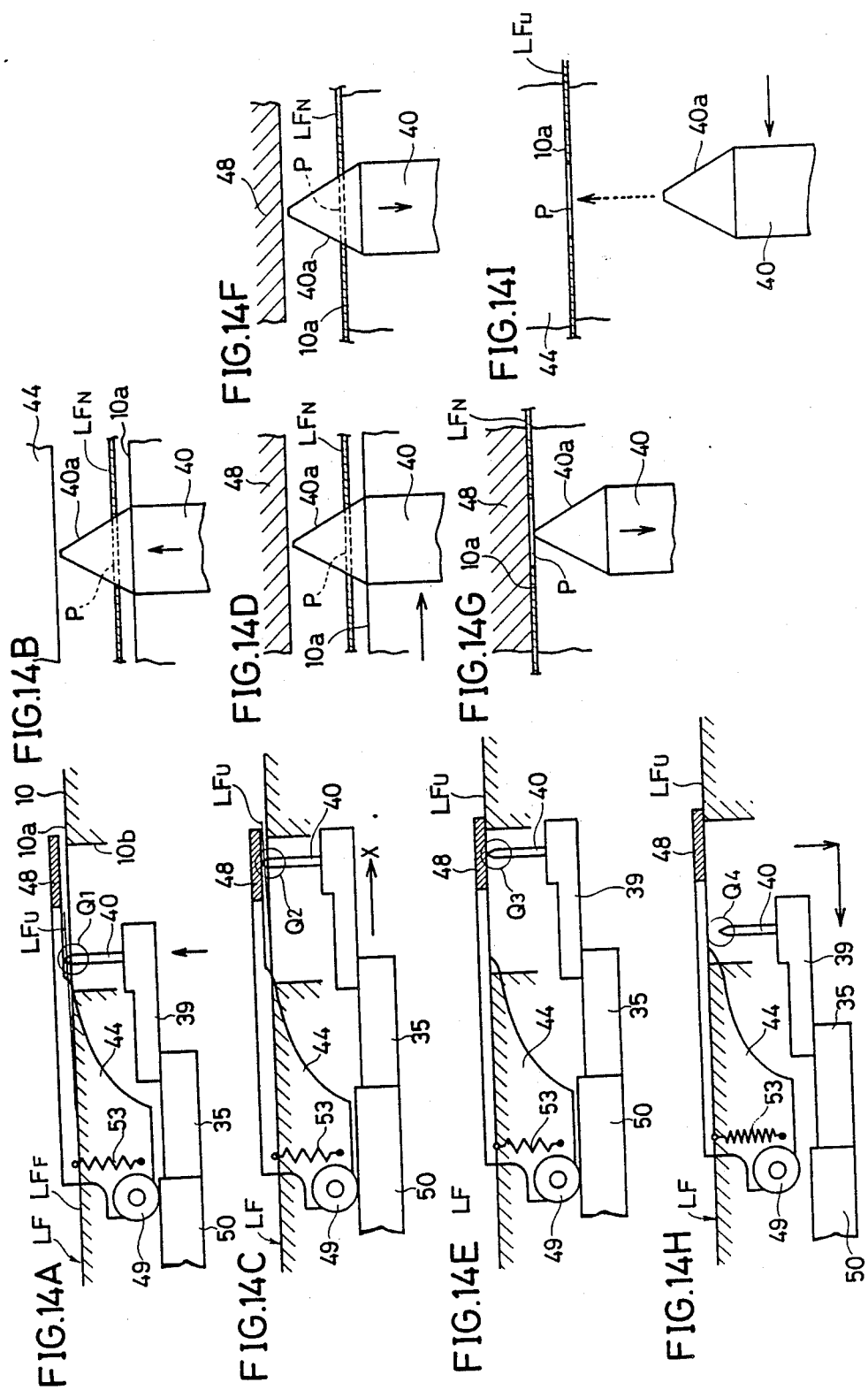

LEAD FRAME CONVEYING APPARATUS

BACKGROUND OF THE INVENTION

1. Field of the Invention

The present invention relates to a conveying apparatus for conveying a lead frame for bonding IC chips to a bonding position thereon and, more specifically, to an improvement in the lead frame conveying apparatus.

2. Description of the Background Art

FIG. 1 is a plan view of a lead frame LF. The lead frame LF comprises an outer lead portion 111, an inner lead portion 112 on which IC chips are bonded and perforations P for conveying the lead frame to the bonding position. Conventionally, the lead frame was conveyed to the bonding position by movement of pins inserted in the perforations P. In the prior art, the size of the perforation P is larger than the diameter of the pin so as to allow insertion of the pin therethrough.

The pin must be always in contact with the edge of the hole of the perforation P in order to enable precise positioning of the inner lead portion 112 of the lead frame LF at a prescribed position to permit the same to be accurately bonded to an integrated circuit, and to maintain the lead frame exactly at the position required.

For this purpose, conventionally, lead frames assembled in continuous longitudinal strips were wound around a feeding reel, as shown in FIG. 1, and the feeding reel was energized in a direction opposed to the feeding direction of the lead frames. Consequently, a back tension was applied on the lead frame, enabling the pin to be in firm contact with the edge of the perforation P in a reliable manner.

When the lead frames are too short to be wound around the feeding reel, V shaped notches (not shown) are formed at end portions on opposite sides of the lead frame. After the lead frame fed to the bonding position is stopped at the prescribed position, V shaped projecting member for positioning engage V shaped notches P of the lead frame from above. Consequently, the inner lead portion is located at the prescribed position for bonding.

However, the above described method of conveying and positioning lead frames are practical only when the lead frame is relatively thick (for example in thickness of no less than 150 μm) and is impractical when the lead frame is thin (for example, when its thickness is 50 to 100 μm). The reason for this is that the tensile strength and the compressive strength of the lead frame are lost when the lead frame is thin, and there will be cracks extending from the edge of the perforation P in the lead frame. Consequently, the precise positioning of the inner lead portion at the prescribed position for bonding becomes impossible and the lead frames would not be properly positioned for bonding.

SUMMARY OF THE INVENTION

Therefore, it is an object of the present invention to facilitate positioning of lead frames by means of an improved conveying apparatus therefor.

Another object of the present invention is to carry out precise positioning of the lead frame at a prescribed position for bonding in a lead frame conveying apparatus.

A further object of the present invention is to prevent cracks or deformation of the lead frame when the lead frame is conveyed, even if it is thin.

A still further object of the present invention is to prevent a shift of the lead frame when the positioning pins are removed from the perforations after the lead frame is positioned at the prescribed position for bonding, in a lead frame conveying apparatus.

A still further object of the present invention is to avoid applying a back tension for positioning in a lead frame conveying apparatus.

A still further object of the present invention is to convey the lead frame while securely holding the same in a lead frame conveying apparatus.

The above described objects of the present invention can be attained by a lead frame conveying apparatus for conveying a lead frame to a bonding position, comprising: a lead frame mounting apparatus for mounting the lead frame having positioning holes of a first dimension for carrying out the positioning function; a transverse conveying apparatus provided below the lead frame positioning apparatus having projecting portions which can be inserted into the lead frame positioning holes for transversely conveying the lead frame by inserting the projecting portions into the positioning holes and by moving the projecting portions, the projecting portions having an upper portion of a second dimension smaller than the first dimension and a lower portion having a third dimension larger than the first dimension; and an elevating apparatus coupled to the transverse conveying apparatus for moving the transverse conveying apparatus in the vertical direction intersecting the transverse direction so that the lead frame is raised away from the the lead frame mounting apparatus when the lead frame is supported by the projecting portions.

Therefore, in a lead frame conveying apparatus which comprises the above described components when the projecting portions are inserted into the positioning holes of the lead frame from under the lead frame, the lead frame is raised away from the lead frame mounting apparatus, since the maximum dimension of the tapered portion of the projecting portion is larger than the dimension of the positioning hole, namely, the tapered portion supports the positioning hole. The raised lead frame lowers itself due to gravity, and is received by the tapered portion of the projecting portion. At the same time, the positioning hole is automatically centered in association with the tapered portion. Consequently, the positioning can be easily carried out in the lead frame conveying apparatus without applying back tension or without providing V shaped projection.

In accordance with a preferred embodiment of the present invention, the projecting portion comprises a pin with an upper end portion having a second dimension and a lower portion having a third dimension, and the pin comprises a plurality of pins formed in a vertical direction crossing the transverse direction.

Since the lead frame conveying apparatus comprises the above described components, the positioning of the lead frame is carried out by two pins. Consequently, a lead frame conveying apparatus can be provided in which positioning is carried out reliably.

In accordance with a more preferred embodiment of the present invention, the lead frame conveying apparatus comprises a lead frame holding apparatus for holding the lead frame when the lead frame is mounted on the lead frame mounting apparatus.

Since the lead frame conveying apparatus comprises the above described component, the relative position of the lead frame is fixed after the lead frame is positioned. Therefore, precise positioning at the prescribed position for bonding becomes possible in the lead frame conveying apparatus.

In accordance with a more preferred embodiment of the present invention, the lead frame holding apparatus comprises a weight for being placed on the lead frame to prevent it from shifting and also includes a lead frame pressing apparatus for pressing the weight onto the lead frame mounting apparatus in order to ensure precise positioning of the lead frame.

Since the lead frame conveying apparatus comprises the above described components, when the projecting portions are extracted from the positioning holes of the lead frame after the lead frame is positioned on the prescribed position for bonding in the lead frame conveying apparatus, the lead frame does not move away from the position where it was placed.

In accordance with a further more preferred embodiment of the present invention, the elevating apparatus raises the plurality of pins at a first position in the transverse direction, lowers the same at a second position in the transverse direction, and the transverse conveying apparatus conveys the lead frame between the first and second positions. Since the lead frame conveying apparatus comprises the above described components, the lead frame can be reliably conveyed in a constant period. Consequently, a lead conveying apparatus can be provided in which the lead frames are precisely positioned and reliably conveyed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a perspective view of a main portion of the lead frame conveying unit shown in FIG. 5;
FIG. 9 is an enlarged view of a tapered portion of a pin;
FIGS. 14A to 14I, 15A and 15B illustrate the operation of the lead frame conveying apparatus.

DESCRIPTION OF THE PREFERRED EMBODIMENTS

Figure 1:
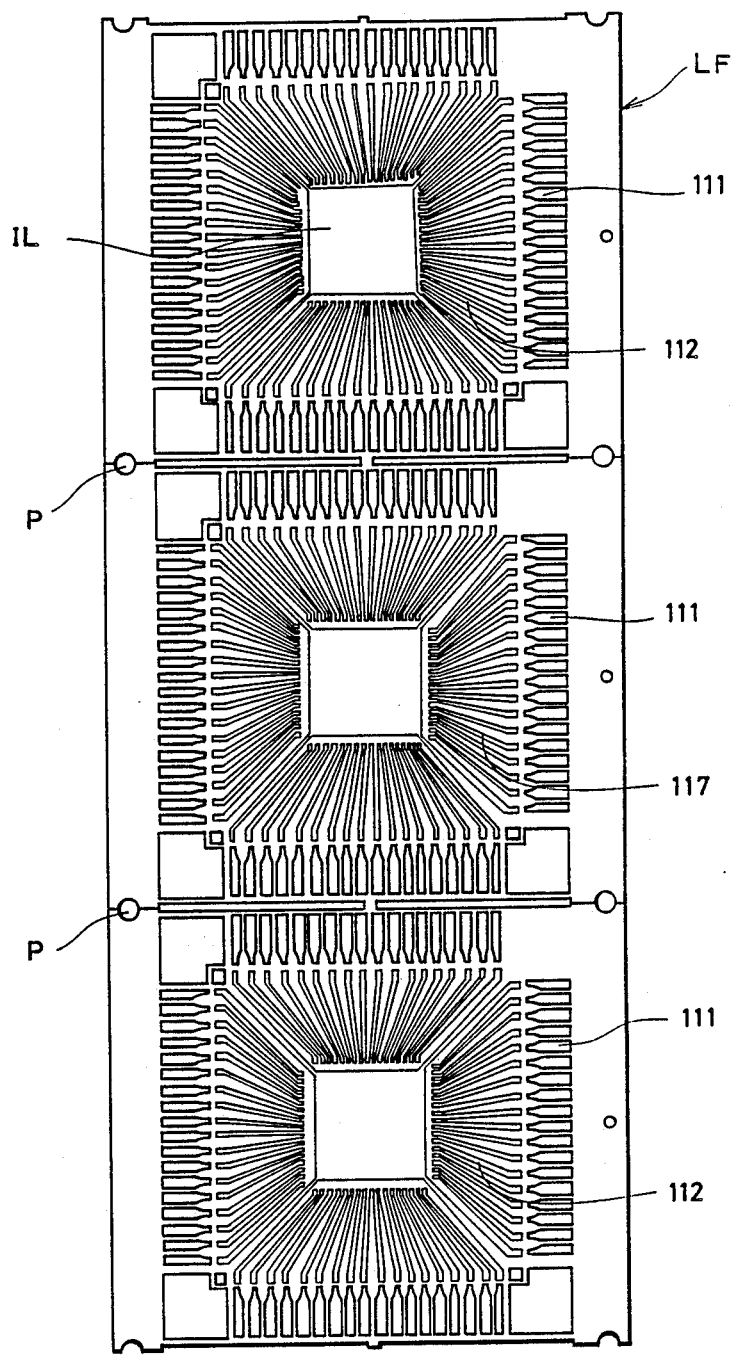
FIG. 1 is a plan view showing lead frames.
Figure 2:
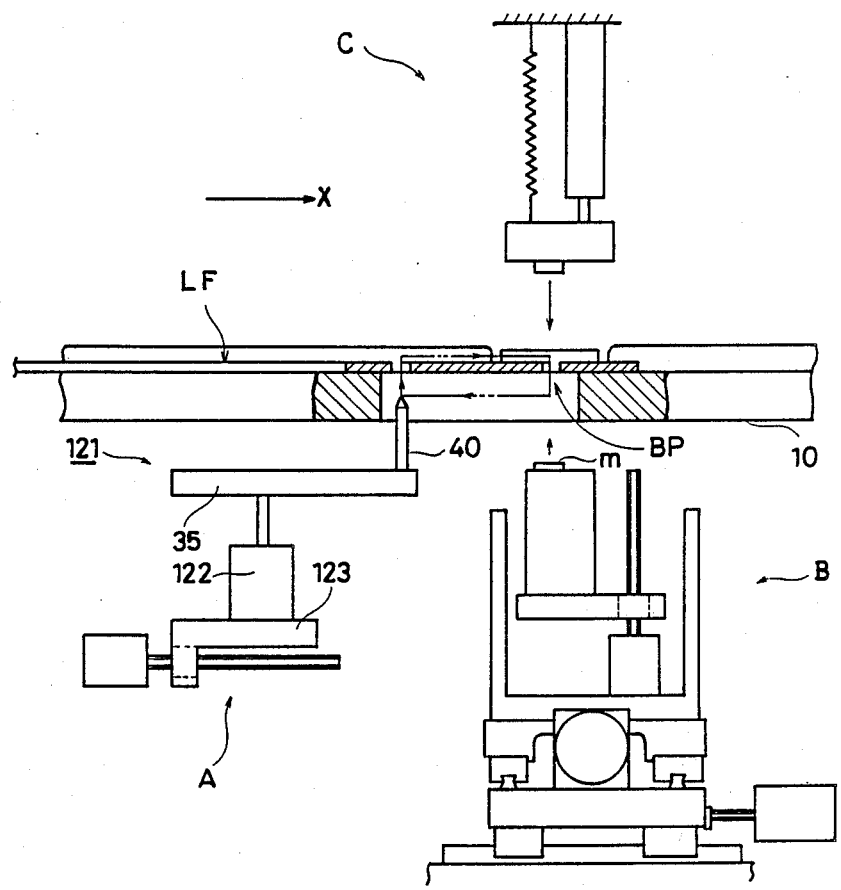
FIG. 2 is a schematic diagram showing the whole structure of a bonding apparatus including the lead frame conveying apparatus.

Below, embodiments of the present invention are described in detail with reference to the figures. FIG. 2 is a schematic diagram of a wireless bonding apparatus to which the lead frame conveying apparatus of the present invention is applied. Referring to FIG. 2, the wireless bonding apparatus incorporating the lead frame conveying apparatus of the present invention comprises: a lead frame conveying unit A for conveying a lead frame LF to a wireless bonding position BP; a bonding tool unit C provided above the bonding position of the lead frame for carrying out wireless bonding of the lead frame; and a bonding stage unit B provided below the bonding position BP for holding the lead frame LF during bonding of the lead frame.

The lead frame conveying apparatus in accordance with the present invention comprises a guide rail 10 for guiding the lead frame, a conveying apparatus 121 provided below the guide rail 10 for transversely conveying the lead frame, an elevating apparatus 122 for elevating the conveying apparatus 121, and a conveying apparatus driving portion 123 for moving the conveying apparatus 121 together with the elevating apparatus 122. The conveying apparatus 121 comprises a feed plate 35 and tapered pins 40 provided on one end portion of the feed plate 35. When the lead frame LF is conveyed, tapered pins 40 are inserted from under the lead frame into a pair of perforations P provided on opposing end portions of the lead frame LF. The diameter of the perforation P of the lead frame LF is smaller than the diameter of the largest portion of the tapered pin, so that the lead frame LF is raised by the tapered pins 40. The conveying apparatus driving portion 123 is driven in this state, and the conveying apparatus 121 moves the lead frame LF to the bonding position BP in the direction X in the figure, as shown by a double dotted line of FIG. 2.

Figure 3:
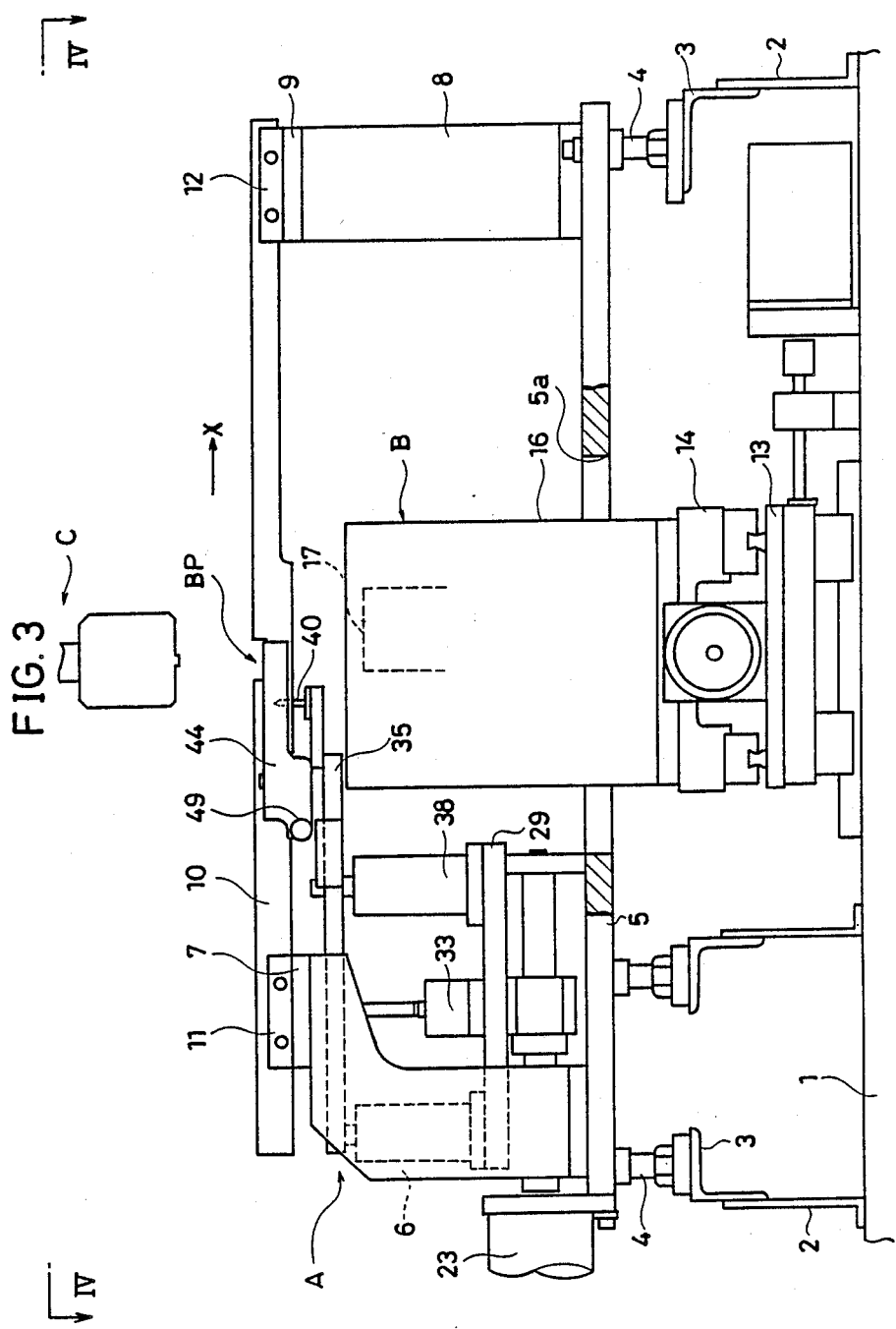
FIG. 3 is a front view showing details of a semiconductor bonding apparatus.

Thereafter, the elevating apparatus 122 is operated to lower the conveying apparatus 121. And as a result, tapered pins 40 are extracted from the perforations P of the lead frame LF. Thereafter, the driving portion 123 is driven in the reverse direction, so that the conveying apparatus 121 and the elevating apparatus 122 are returned to their original positions. The lead frames LF are continuously fed to the bonding position BP by the movement (shown by the double dotted line in the figure) of the lead frame conveying unit A. Wireless bonding is carried out on the lead frame by means of the bonding stage unit B and the bonding tool unit C at this position. FIG. 3 is an enlarged view showing the details of the wireless bonding apparatus shown in FIG. 2 and FIG. 4 is a plan view of the wireless bonding apparatus, viewed from the line IV—IV of FIG. 3.

Figure 4:
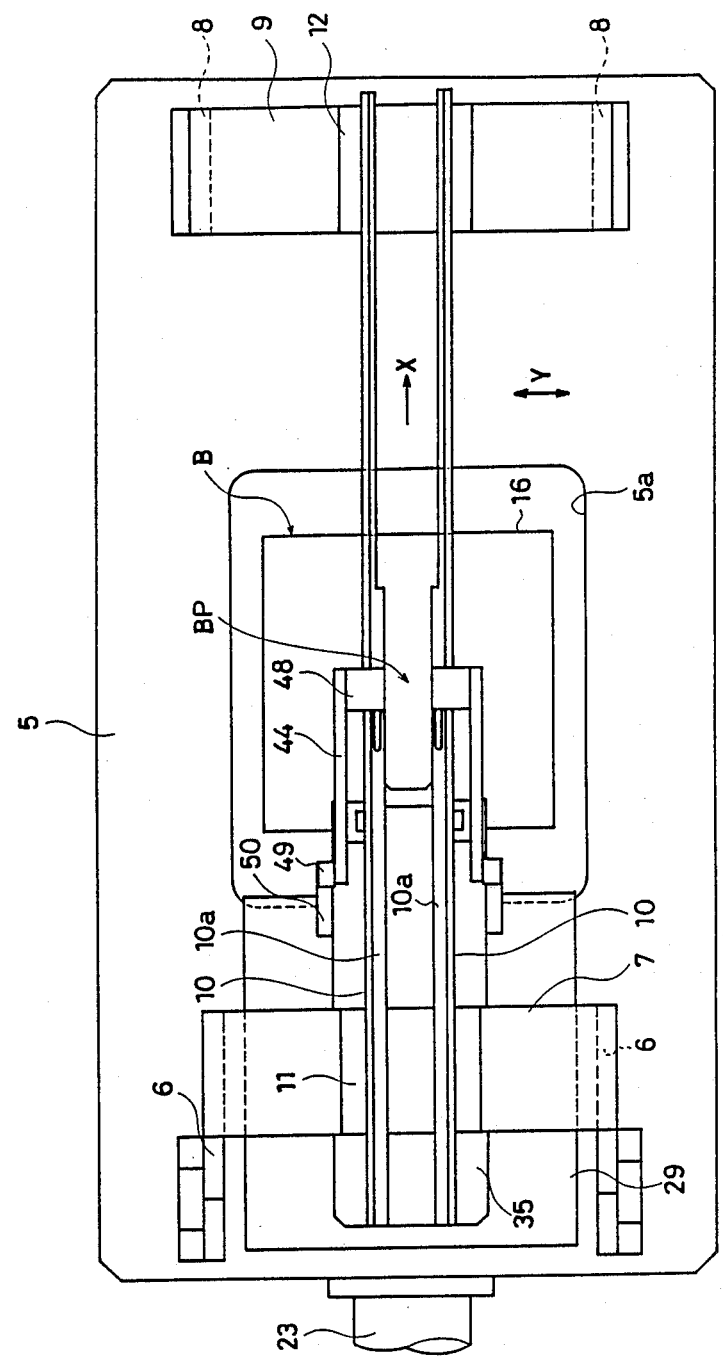
FIG. 4 is a plan view of the semiconductor bonding apparatus shown in FIG. 3.

Referring to FIGS. 3 and 4, the structure of the wireless bonding apparatus to which the lead frame conveying apparatus of the present invention is applied will be described in detail. A fixed frame 3 formed of a bracketed member is attached to a fixed base 1 through a vertical support frame 2. A horizontal fixed base 5 is attached to the fixed frame 3 through adjusting bolts 4. In the upstream side relative to the direction X, a pair of inverted L shaped stays 6 are provided on the left and right ends of the upper surface of the fixed base 5. A rear rail supporting plate 7 is provided on the upper ends of each of the pair of stays 6, which plate is horizontal in the Y direction, orthogonally crossing the X direction (see FIG. 4).

In the downstream side in the X direction, a pair of stays 8 are provided on the left and right ends of the upper surface of the fixed base 5. A horizontal front rail supporting plate 9, extending in the Y direction, is provided on the upper surface of the pair of stays 8. A pair of guide rails 10 are placed between the front rail supporting plates 9 and the rear rail supporting plate 7 in parallel to the X direction. The guide rails 10 are respectively fixed to the pairs of stays 6 and 8 through fixing plates 11 and 12, respectively. Both guide rails have approximately L shaped cross section. A step is formed on the inner side of each of the guide rail 10 at an intermediate portion in the vertical direction, with the upper surface of the step constituting a guiding surface 10a for mounting and guiding the lead frame LF (see FIG. 8.).

The lead frame conveying unit A is fixed on the fixed base 5 below and on the upstream side of the guide rails 10 for conveying the lead frame LF. The specific structure of the lead frame conveying unit A will be described later.

The central portion of both guide rails 10 in the X direction is defined as the bonding position BP. The bonding position BP is at the central portion of the guide rails 10 in the Y direction, and it is at the same height as the guide rail 10.

The bonding stage unit B is provided at the central position of the fixed base 1 below the bonding position BP. The bonding stage unit B comprises an X table 13, a Y table 14, a stage box 16 and a bonding stage 17. The stage box 16 vertically penetrates a large opening 5a at the center of the fixed base 5.

The bonding tool unit C is provided above the bonding position BP, at a position opposed to the bonding stage unit B. The specific structures of the bonding stage unit B and the bonding tool unit C will be described later.

Figure 5:
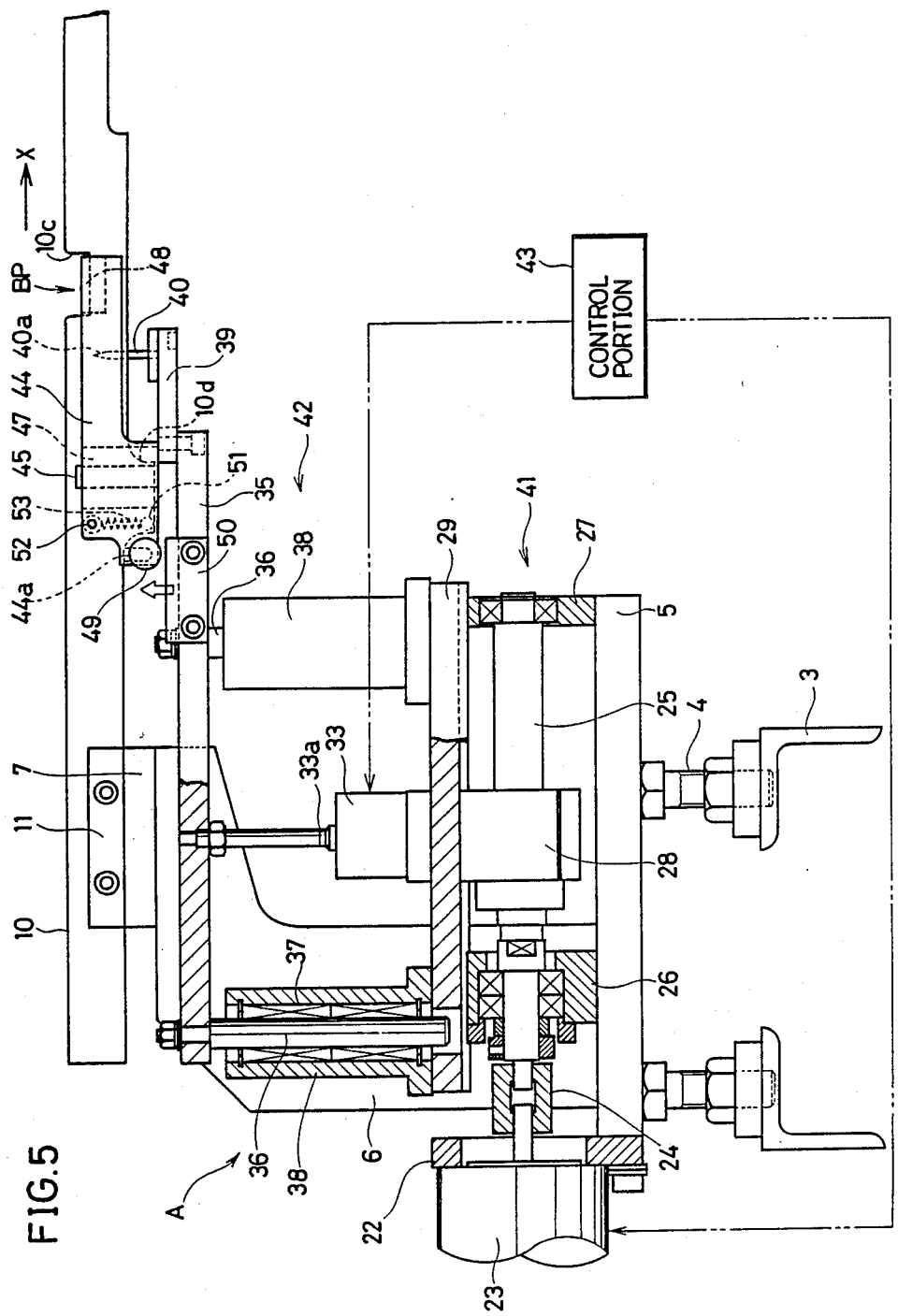
FIG. 5 is a front view showing a specific structure of a lead frame conveying unit.
Figure 6:
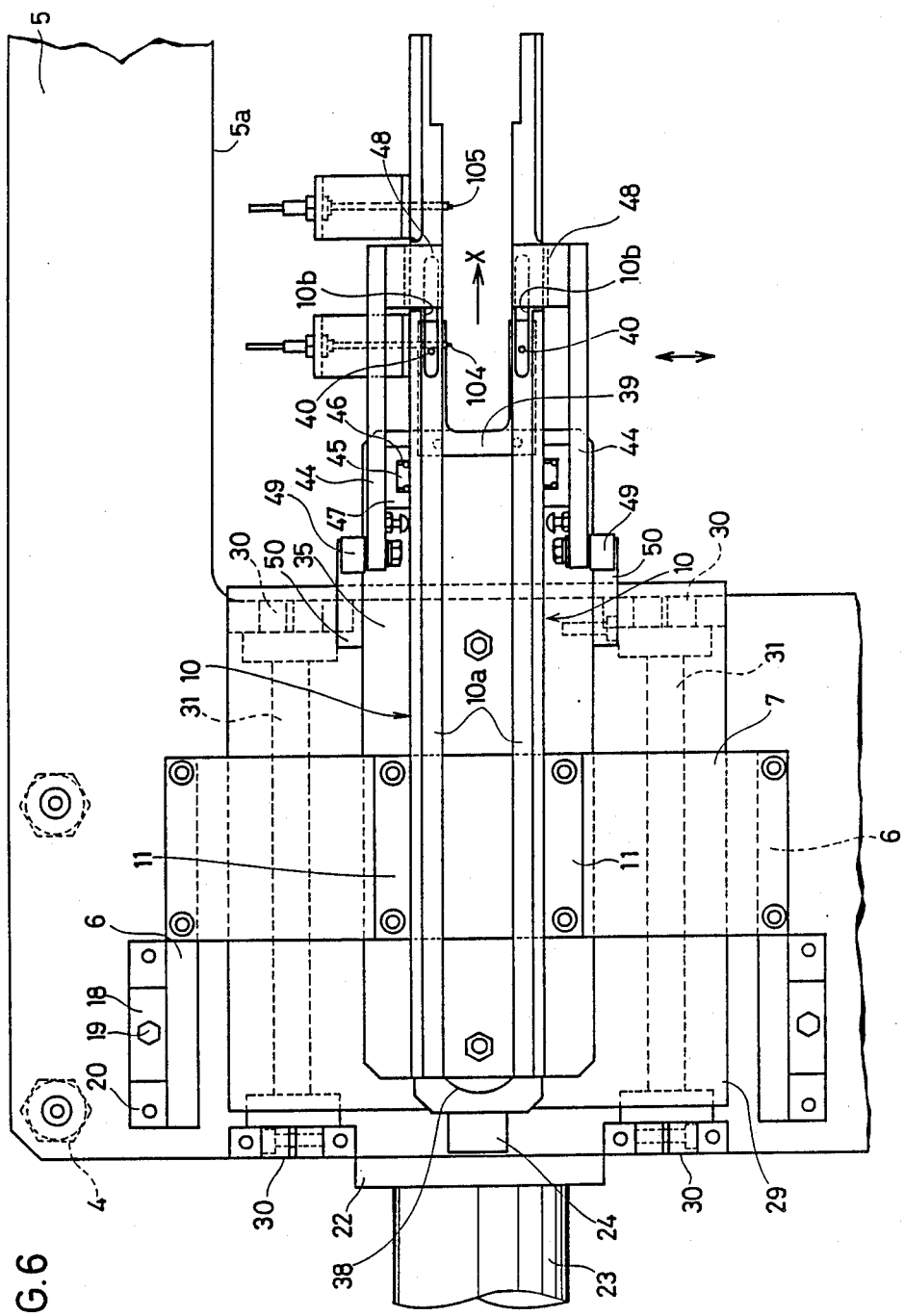
FIG. 6 is a plan view of the lead frame conveying unit shown in FIG. 5.
Figure 7:
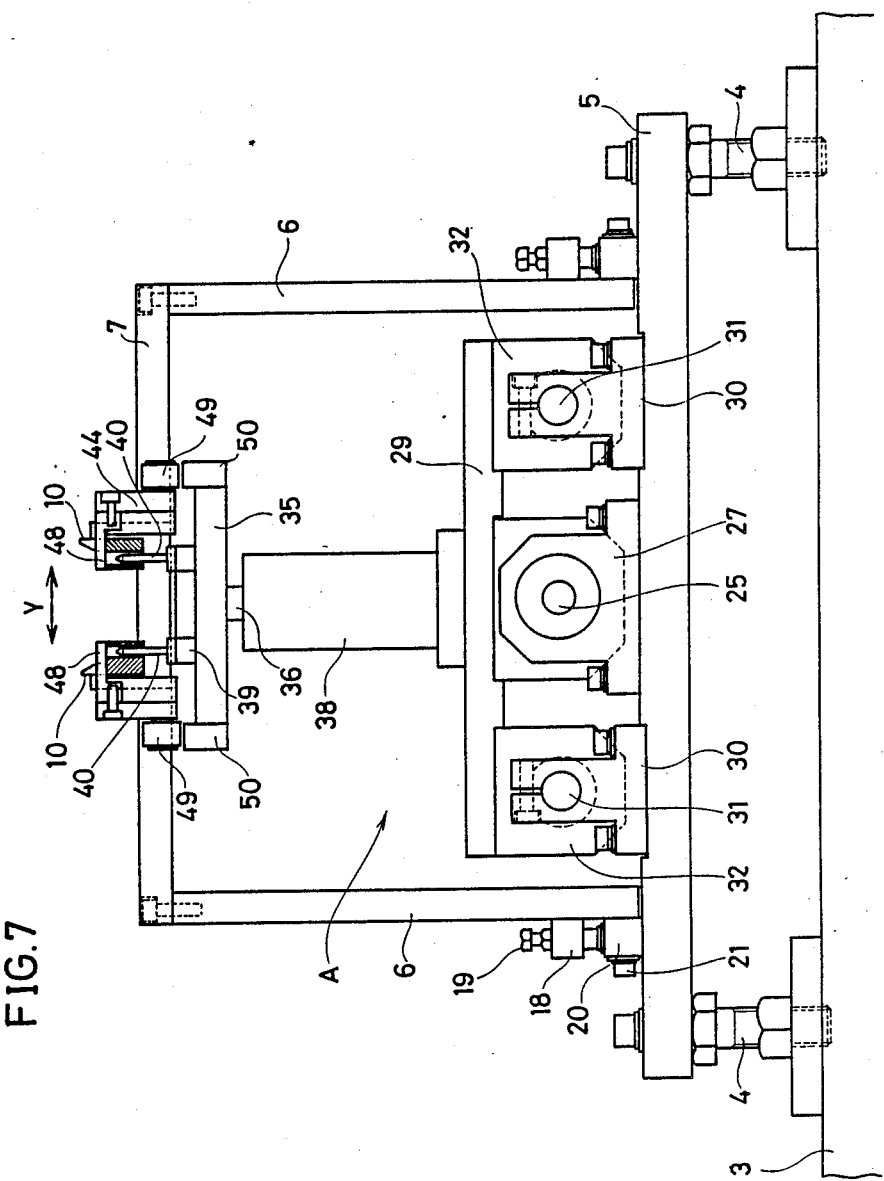
FIG. 7 is a side view of a lead frame conveying unit shown in FIG. 5.

The structure of the lead frame conveying apparatus will be presently described with reference to FIGS. 5 to 8. Briefly, the lead frame conveying apparatus comprises the lead frame conveying unit A and the guide rail 10. FIG. 5 is a front view of the lead frame conveying apparatus, FIG. 6 is a plan view of the lead frame conveying apparatus, FIG. 7 is a side view of the lead frame conveying apparatus and FIG. 8 is a perspective view of a main portion of the lead frame conveying apparatus. Referring to FIG. 7, the previously mentioned inverted L shaped stays 6 are such that the height thereof can be finely adjusted in association with the fixed base 5. More specifically, an adjustment bolt 19 is screwed in the longitudinal direction on the fixing plate 18 on the side surface of the stay 6, and the adjustment bolt 19 is in contact with the upper surface of the central portion of the support plate 20 on the upper surface of the fixed base 5. By rotating the adjustment bolt 19, the height of the stay 6 is finely adjusted. After the adjustment, further rotation of the adjustment bolt 19 is prevented by fastening a stopper bolt 21 threaded in the lateral direction on the support plate 20. Thus, the height position of the stay 6 is locked.

Although not shown, the same structure is provided on the stay 8 shown in FIG. 3.

Referring to FIG. 5, the conveying apparatus driving portion 123 comprises a stepping motor 23 provided at an end portion of the fixed base 5 through a motor bracket 22, a screw axis 25 of a ball thread whose output axis is coupled through a coupling 24, bearing units 26 and 27 for supporting both ends of the screw axis 25 on the fixed base 5, and a movable base plate 29 fixed on a nut 28 coupled to the screw axis 25 of the ball thread by means of balls (not shown), which plate reciprocates along the X direction.

As shown in FIG. 6, the conveying apparatus driving portion 123 further comprises guide rods 31 provided on both side of the screw axis 25, pillow blocks 30 for fixing the guide rods 31 to the fixed base 5, guide block 32 for fixing the movable base plate 29 and the guide rod 31.

The elevating apparatus 122 comprises an elevating air cylinder 33, at the center of the upper surface of the movable base plate 29, and guide cylinders 38 on the upstream side and on the downstream side of the elevating air cylinder 33 on the movable base plate 29 for elevating a feed plate 35 fixed on a piston rod 33a of the elevating air cylinder 33 in association with the elevation of the same, while maintaining the feed plate 35 level. The guide cylinder 38 moves an elevating guide rod 36 in the vertical direction through a slide bearing 37 provided therein.

The conveying apparatus 121 comprises a piston rod 33a of the elevating air cylinder 33, a feed plate 35 fixed on the elevating guide rod 36, C shaped pin mounting plate 39 (see FIG. 6) provided on the upstream side in the X direction of the feed plate 35 and tapered pins 40 facing upward at two portions at an end portion of the pin mounting plate 39. Each of the tapered pins 40 are adapted to penetrate an elliptical hole 10b on the guiding surface 10a of each of the guide rails 10 (see FIGS. 6 and 8).

As shown in FIG. 9, the tapered pin 40 has a tapered portion 40a at the upper end thereof and is arranged such that the tapered portion 40a is inserted from under the lead frame arranged on the guiding surface 10a of the guide rail 10 into each of a pair of perforations on the left and right sides of the lead frame. The diameter $\phi_1$ of the largest portion of the tapered portion 40a (in this embodiment, it is equal to the diameter of the tapered pin 40) is larger than the diameter $\phi_2$ of the perforation P.

When the stepping motor 23 is driven in alternate directions, the movable base plate 29 reciprocates in the X direction through the coupling 24, the screw axis 25 of the ball thread and the nut 28. Accordingly, the elevating air cylinder 33, the elevating guide rod 36 and the feed plate 35 reciprocate in the X direction, thereby imparting to the tapered pins 40 and to the pin plate 39 similar movement.

When the elevating air cylinder 33 is lowered and raised, the feed plate 35, the pin mounting plate 39 and the tapered pins 40 are correspondingly lowered and elevated together with the elevating guide rod 36 which is guided by the guide cylinder 38. When the elevating air cylinder 33 reaches the end of its retraction stroke, i.e., at its lowermost portion the upper end of the tapered portion 40a of the tapered pin 40 is at a position lower than the guiding surface 10a of the guide rail 10. When the elevating air cylinder 33 is at its highest point, the upper end of the tapered portion 40a is at a position higher than the guiding surface 10a of the guide rail 10. The conveying apparatus driving portion 123 and the elevating apparatus 122 are sequentially controlled by a control portion 43. Since the lead frame conveying unit A is controlled as described above, the tapered pins 40 are subjected to the following.

(1) Forward movement of the tapered pins 40 by rotation of the stepping motor 23 in the forward direction.

(2) Lowering of the tapered pins 40 by lowering of the elevating air cylinder 33.

(3) Rearward movement of the tapered pins 40 by the rotation of the stepping motor 23 in the reverse direction.

(4) Elevation of the tapered pins 40 by raising of the elevating air cylinder 33.

The tapered portion 40a of the tapered pin 40 moves along the track shown by the double dotted line in FIG. 2, in accordance with the above described sequential control scheme.

Since the largest diameter $\phi_1$ of the tapered portion 40a is larger than the diameter $\phi_2$ of the perforation P, the edge of the perforation P engages the tapered portion 40a when the tapered portion 40a is inserted into the perforation P from underside thereof as the tapered pin 40 is raised. Consequently, the lead frame portion $LF_N$ near the perforation P is raised from the guiding surface 10a of the guide rails 10 (see FIG. 9), and, due to the weight of the lead frame portion $LF_N$ the perforation P becomes automatically centered relative to the tapered portion 40a.

The conveying apparatus 121 further comprises a weight holding frame 44 on the upstream side of the bonding portion BP and more outwardly than the guide rails 10 which frame 44 is adapted to be freely elevated and lowered. A rail member 45 is provided on the outside of the guide rails 10 for guiding the weight holding frame 44 in the vertical directions and; a guide member 47 provided on the weight holding frame 44 serves for engaging the rail member 45 with the weight holding frame 44. A plurality of guide balls 46 (see FIG. 6) enable smooth elevating and lowering of the guide member 47 on the rail member 45, and a lead frame weight 48 for being placed on the lead frame serves for preventing shifting of the same is provided at a front end in the X direction of the weight holding frame 44. Notches 10c are formed at portions on the guide rails 10 which portions correspond to the lead frame weight 48. The lead frame weight 48 is such that its weight is in contact with and separated from the guiding surface 10a of the guide rail 10 in the vertical direction at the positions of notches 10c.

As shown in FIG. 8, an elliptical hole 44a which extends in a longitudinal direction is formed at a rear end of each weight holding frame 44. An axis portion of a cam follower 49 passes through the elliptical hole 44a to be fixed by a nut. Meanwhile, guide plates 50 which can be brought into contact with the cam followers 49 from the underside thereof same are fixed on the left and right side surfaces of the feed plate 35. The length in the X direction of the guide plate 50 is a little longer than the stroke of the feed plate 35 which is driven by the stepping motor 23.

The conveying apparatus 121 further comprises a screw 51 screwed on a lower projecting portion 10d of the guide rail 10 from the outside thereof at a portion near where a fitting of the guide member 47 and the longitudinal rail member 45 occurs. A screw 52 is screwed on the weight holding frame 44 from the inside thereof at a position upper than the screw 51 and a tension spring 53 is provided between the screws 51 and 52 for biasing the weight holding frame 44 downward. Since the conveying apparatus 121 further comprises the above described components, when the feed plate 35 is elevated, the guide plate 50 is brought into contact with the cam follower 49 and the weight holding frame 44, the pin mounting plate 39 and the tapered pins 40 are integrally elevated through the cam follower 49. This elevation expands the tension spring 53 for forcefully pressing the plate. When the feed plate 35 is lowered, the weight holding frame 44 is lowered by the force of the spring 53 providing forceful pressing. In other words, the weight holding frame 44 is elevated and lowered in association with the elevating and lowering of the feed plate 35.

Figure 10:
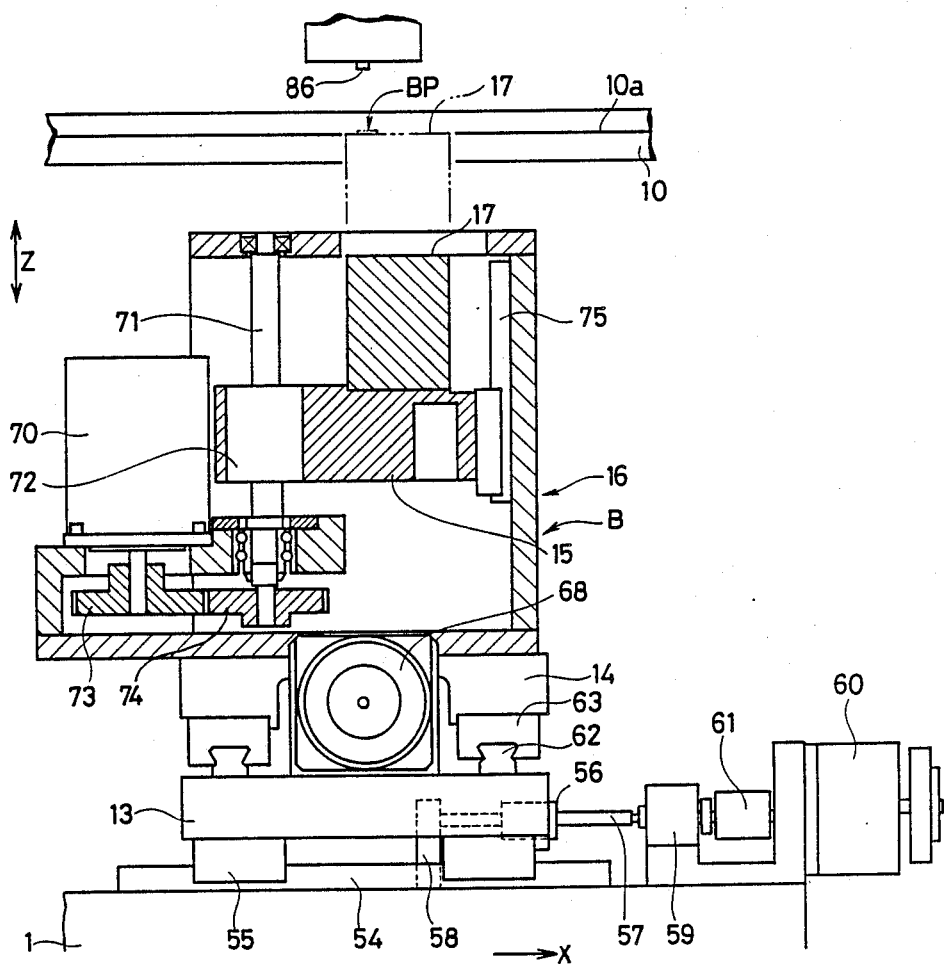
FIG. 10 is a front view showing a schematic structure of a bonding stage unit.
Figure 11:
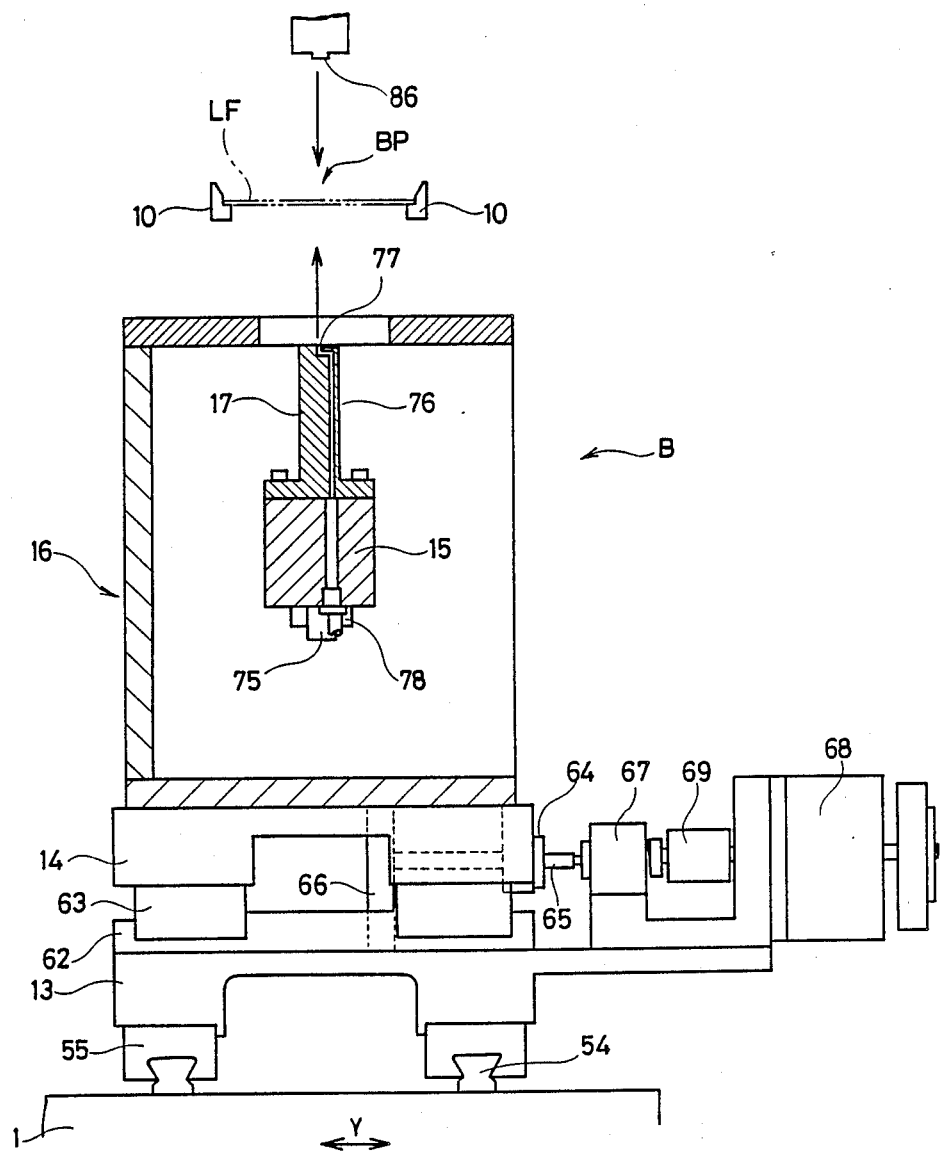
FIG. 11 is a side view of the bonding stage unit shown in FIG. 10.

A specific structure of the bonding stage unit B is next described with reference to FIGS. 10 and 11.

Rail guides 55 on the lower surface of an X table 13 are fixed in a given position along the X direction on rails 54 which are fixed on the fixed base 1. A nut 56 of a ball screw is attached at a lower surface of an end portion of the X table 13. Both end portions of a screw axis 57 which engage with the nut 56 through balls are supported by bearing units 58 and 59 mounted on the fixed base 1. An output axis of a X direction stepping motor 60 attached on one end of the fixed base 1 is coupled to one end of the screw axis 57 through a coupling 61.

Rail guides 63 on the lower surface of a Y table 14 are fixed in Y direction oriented rails 62, of fixed on the X table 13. A nut 64 of a ball screw is fixed on a lower surface at an end portion of the Y table 14. Both end portions of a screw axis 65 which engage with the nut 64 through balls are supported by bearing units 66 and 67 attached on the X table 13. A screw axis of a Y direction stepping motor 68 attached at one end of the X table 13 is coupled to one end of the screw axis 65 through a coupling 69.

The X direction stepping motor 60 and the Y direction stepping motor 68 are operated by a X-Y joy stick, not shown.

A stage box 16 is mounted on an upper surface of the Y table 14, in which are contained a Z direction (see FIG. 10) stepping motor 70, a Z block 15, a ball screw for elevating the Z block 15, and so on. The screw axis 71 of the ball screw is supported in the vertical direction, with the nut thereof fixed on the Z block 15. An output gear 73 of the Z direction stepping motor 70 is engaged with a driven gear 74 at a lower end of the screw axis 71. When the Z direction stepping motor 70 is driven, the Z block is selectively elevated and lowered along the guide rail 75.

A bonding stage 17 for performing bonding is fixed on the upper surface of the Z block 15. A suction tube 76 is formed in the bonding stage 17. The suction tube 76 is positioned at the upper surface of the bonding stage 17 directly below the bonding position BP providing a suction opening 77. The other end of the suction tube 76 is connected to a section pipe 78.

Figure 12:
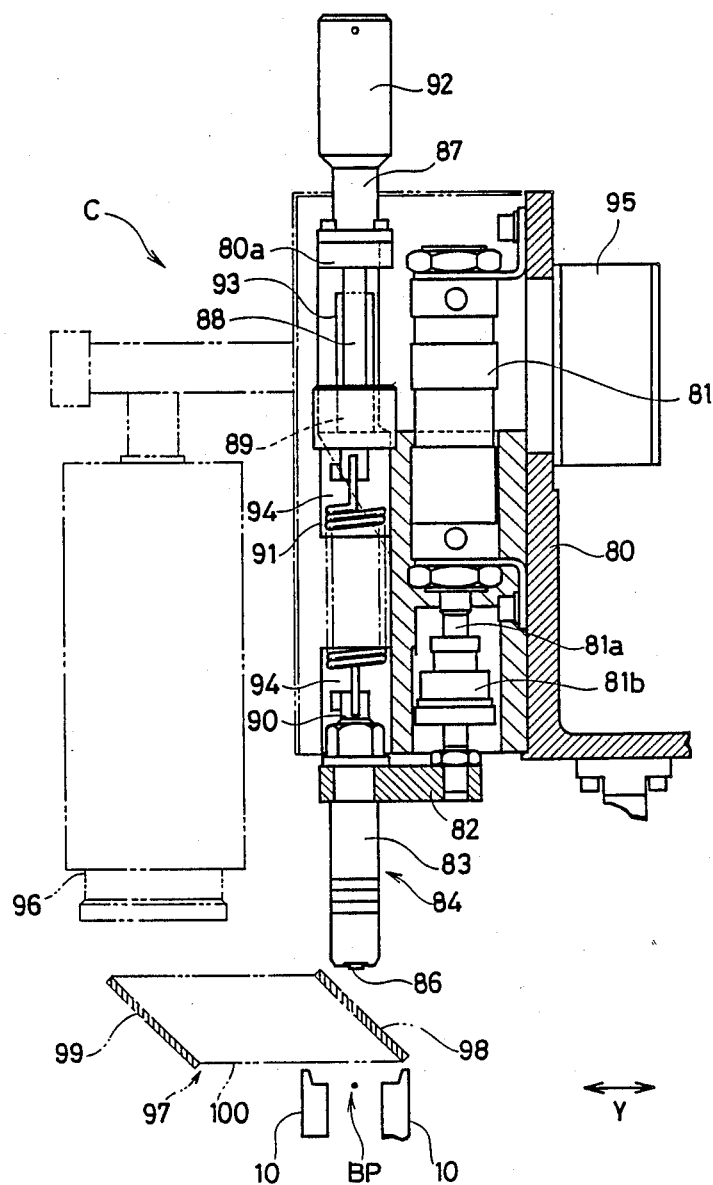
FIG. 12 is a front view showing a specific structure of a bonding tool unit.
Figure 13:
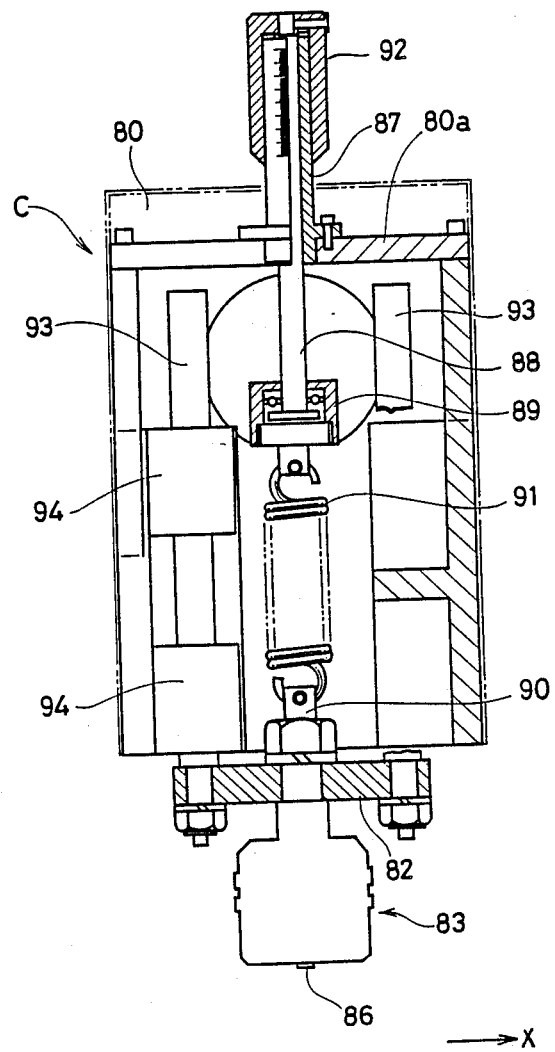
FIG. 13 is a side view of the bonding tool unit.

The schematic structure of the bonding tool unit C will be described in the following with reference to FIGS. 12 and 13. An air cylinder 81 which can be reciprocated in the vertical direction is attached on a fixed frame 80 on the fixed base 1. One end of a tool holding plate 82 is fixed to a piston rod 81a through a floating joint 81b. A tool base 84 is fixed on the lower surface of the other end of the tool holding plate 82. A heater (not shown) is detachably attached to a tool holding block 83 comprising the tool holding plate 82 and the tool base 84. A bonding tool 86 having approximately the same size as an IC chip m (see FIG. 14) is integral with and protrudes from the central portion of the lower end of the tool holding block 83. The bonding tool 86 is located directly above the suction opening 77 of the bonding stage 17. As is shown in FIG. 13, a cylindrical nut 87 is fixed on an upper plate 80a of a fixed frame 80. A bolt 88 is screwed on the cylindrical nut 87. A buffer tension spring 91 is provided between a spring bearing block 89, rotatably fixed on the lower end of the bolt 88, and a spring bearing block 90 attached on the upper surface of the tool holding plate 82. The upper end of the bolt 88 protrudes upward from the cylindrical nut 87 on which a rotation knob 92 is fixed. The knob 92 is cylindrical and is rotatably provided on the cylindrical nut 87.

The bonding tool unit C further comprises a guide rod 93 which projects from the tool holding plate 82 in the vertical direction, a guide block 94 passing through the guide rod 93 fixed on the fixed frame 80 and a motor 95 (see FIG. 12) for a cooling fan, fixed on the fixed frame 80.

The air cylinder 81 is driven such that it projects out with a constant pressure. The bonding pressure corresponding to the types of IC chips m or of the lead frames LF can be adjusted by changing the tension of the buffer tension spring 91 by rotating the knob 92.

A microscope 96 is provided on a side portion of the bonding tool unit C in the Y direction for picking up relative positions of the inner lead portion IL of the lead frame LF and the IC chip m on the bonding stage 17. The image picked up by the microscope 96 is displayed on a monitor display, not shown.

When the microscope 96 is shifted in the Y direction from the bonding position BP, light from the bonding position BP must be transmitted to the microscope 96 in order to detect the shift. For this reason, a reflection mirror unit 97 is provided. The reflection mirror unit 97 comprises a first reflecting mirror 98 located directly above the bonding position BP and inclined downward by 45°, a second reflecting mirror 99 arranged directly below the microscope 96 and inclined upward by 45° and a reflecting mirror holding frame 100 for holding the reflecting mirrors 98 and 99.

Since the reflection mirror unit 97 is located directly below the bonding tool 86, the unit 97 must be retracted when the bonding tool 95 is lowered. For this purpose, a link mechanism (not shown) which swings in association with the elevation of the tool holding plate 82 is attached to the fixed frame 80. An end portion of the link mechanism is coupled to the reflecting mirror holding frame 100.

The bonding tool unit C comprises an optical sensor 104 for detecting the arrival of the edge of the lead frame LF at the bonding position BP and an optical sensor 105 for detecting passage of the rear end of the lead frame LF through the bonding position BP (see FIG. 6).

The operation of the present embodiment of the lead frame conveying apparatus in accordance with the present invention will be described next with reference to FIGS. 14A to 14I.

First, the tapered pins 40 are caused to assure their original positions for which the elevating air cylinder 33 is raised, the feed plate 35, the guide plate 50 and the pin mounting plate 39 are elevated so that the two tapered pins in the elliptical holes 10b of the guide rails 10 protrude higher than the guiding surface 10a of the guide rail 10, as shown in FIG. 14A. The original position is selected as described above since the pair of perforations P on the left and and right sides of the leading lead frame portion $LF_U$ must be manually engaged with the tapered portions 40a of the tapered pins 40 to start the operation. This step corresponds to the step (1) of the above described sequential operation (1) to (4).

At this time, the cam follower 49 is raised by the guide plate 50. Therefore, the weight holding frame 44 is at an elevated state, and its lead frame weight 48 is separated from the guiding surface 10a of the guide rails 10. The tension spring 53 for forceful pressing is expanded. A heater contained in the tool holding block 83 is continuously energized, and the bonding tool 83 is controlled to have a prescribed temperature.

In the above described initial state, the left and right perforations P which are then at prescribed positions in the longitudinal direction of the leading unit lead frame portion $LF_U$ of the lead frame LF are manually fitted over the tapered portions 40a of the tapered pins 40. For this operation, a conveying robot or the like may be employed to mechanically insert the tapered pins 40 into the perforations P and to place the lead frame LF on the guiding surface 10a of the guide rails 10.

The lead frame portion $LF_N$ near the perforations P this fitted onto the tapered portions 40a by the aforementioned operation with then lower itself due to its own weight. Consequently, the peripheral edge of the perforation P is supported at a position of the tapered portion 40a which has the same diameter as that of the perforation P, as shown in FIG. 14B which is an enlarged view of a circled portion $Q_1$ of FIG. 12A. In this position, the lead frame is supported a small distance above the guide surface 10a of the guide rail 10. Therefore, the lead frame portion $LF_N$ near the perforations P will not make contact with the guiding surface 10a. However, most of the remaining lead frame portions $LF_F$ are settled on the guiding surface 10a.

Thereafter, the stepping motor 23 of the lead frame conveying unit A is driven in the forward direction, driving forward the nut 28, the movable base plate 29, the elevating air cylinder 33, the elevating guide rod 36, the feed plate 35, the pin mounting plate 39 and a pair of tapered pins 40 thus, the aforementioned components will move forward together in the X direction through the rotation of the screw axis 25. Each tapered pin 40 moves in the elliptical hole 10b of the guide rail 10 as shown in FIG. 14C and, when the bonding position BP is reached, the stepping motor 23 is stopped. During the forward movement, the guiding plate 50 integral with the feed plate 35 maintains the weight holding frame 44 at an elevated state by means of the cam follower 49. The forward movement of the feed plate 35 is smoothed by the rotation of the cam follower 49. FIG. 14D is an enlarged view of a circled portion $Q_2$ of FIG. 14C.

Thereafter, the elevating air cylinder 33 is retracted, so that the feed plate 35, the guide plate 50, the pin mounting plate 39 and a pair of tapered pins 40 are lowered together. Consequently, the tapered portions 40a of the tapered pins 40 are retracted to a position lower than the guiding surface 10a of the guide rail 10, as shown in FIG. 14E. Therefore, the lead frame portion $LF_N$ which had been separated from the guiding surface 10a by the tapered portions 40a is placed on the guiding surface 10a. FIG. 14G is an enlarged view of the circled portion $Q_3$ of FIG. 14E, and FIG. 14F shows an intermediate state from that shown in FIG. 14D to FIG. 14G, when the lead frame portion $LF_N$ has just seen placed on the guiding surface 10a.

When the tapered pins 40 are retracted downward, the weight holding frame 44 is forcefully lowered by the tension of the tension spring 53 which extends between the weight holding frame 44 and the guide rail 10. Consequently, both side end portions of the lead frame portion $LF_N$ placed on the guiding surface 10a are pressed by the lead frame weight 48 immediately after the lead frame has been placed in its proper location.

While, the tension spring 53 which assists the lowering of the weight holding frame 44 onto the lead frame weight 48 is not absolutely necessary since the weight 48 will automatically lower itself due to gravity, but the provision thereof is preferred for the following reasons.

If there is friction between the rail member 45 in the vertical direction and the guide member 47, the pressing of the lead frame LF by the lead frame weight 48 will be delayed, or the pressing itself will not be carried out, causing shifting of the lead frame LF.

However, in the present embodiment, by the virtue of the tension spring 53 which produces forced pressing, the pressing of the lead frame LF is immediately and effectively carried out when the tapered portions 40a are retracted.

Thereafter, the stepping motor 23 is driven in the reverse direction, and the feed plate 35, the tapered pins 40, the guide plate 50, etc. are retracted together. This state is shown in FIG. 14H. FIG. 14I is an enlarged view of the circled portion $Q_4$ of FIG. 14H. In this state, the tapered pins 40 are in a standby state directly below the original position. At the original position, there will now be located are the perforations P of the next lead frame portion $LF_U$ corresponding to the inner lead portion IL which is the object of the next bonding operation.

Figure 15A:
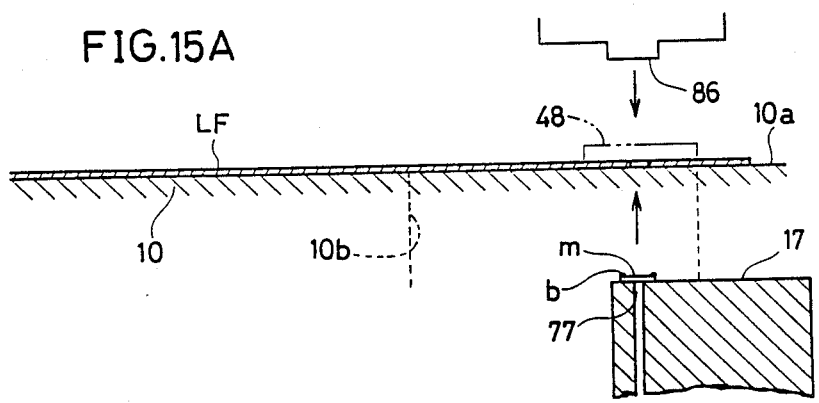
Figure 15B:
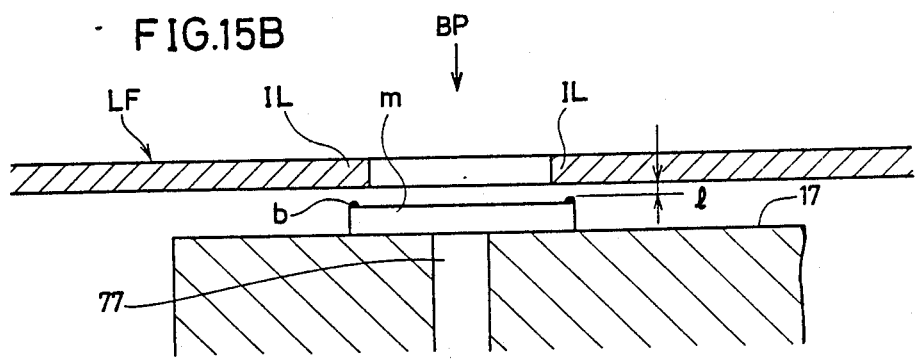

Referring to FIGS. 15A and 15B, the bonding operation is described. After the lead frame is positioned as shown in FIG. 14H, an IC chip m with a bump which had been prealigned in X, Y and θ direction in a prealignment portion, not shown, is attracted by a traverser, not shown, and is placed on the suction opening 77 of the bonding stage 17 as shown in FIG. 15A. An electro magnetic valve provided on the suction pipe 78 is turned on, and therefore a negative pressure is applied at the suction opening 77 through the suction tube 76. Consequently, the IC chip m is attracted and held facing upward on the bonding stage 17. When the attraction thereof is detected by a pressure gauge (not shown) on the suction pipe 78, the suction of the traverse arm is stopped and the traverse arm is returned to the prealignment portion.

Thereafter, the Z direction stepping motor 70 is rotated in the forward direction, and the screw axis 71 is rotated by means of the output gear 73 and the driven gear 74. When the screw axis 71 is rotated, the bonding stage 17 together with the nut 72 are elevated, and the Z direction stepping motor 70 is stopped when the bump b of the IC chip m reaches a position below and spaced apart from the guiding surface 10a of the guide rail 10 by a small distance l (for example 0.5 mm), as shown in FIG. 15B.

The IC chip m is stopped below the guiding surface 10a in order to prevent contact of the lead frame LF with the bump b of the IC chip m when the IC chip m is moved for adjustment in the X and Y directions by the movement of the bonding stage 17 by an operator watching the monitor display in a succeeding step. The small distance l is smaller than the focal depths of the microscope 96.

The relative positions of the inner lead portion IL of the lead frame LF and the bump b of the IC chip m picked up by the microscope 96 is displayed on the monitor display. The operator operates an X-Y joy stick while checking the display so as to align each inner lead portion IL with each bump b in both X and Y directions by driving the X direction stepping motor 60 and the Y direction stepping motor 68.

After the alignment, a start switch, not shown, is turned on, whereby the Z direction stepping motor 70 of the bonding stage unit B is again driven in the forward direction, the bonding stage 17 is further elevated, and the Z direction stepping motor is stopped when the upper surface of the IC chip m reaches the same height as the guiding surface 10a of the guide rail 10. Consequently, the inner lead portion IL which is the object of bonding is brought into contact with the bump b of the IC chip m.

Thereafter, the air cylinder 81 of the bonding tool unit C is extended, and as the piston rod 81a in being lowered, the tool holding plate 82, the tool holding block 83 and the bonding tool 86 are lowered together with it. In association with this lowering, a link mechanism (not shown) is operated, whereby the reflection mirror unit 97 is retracted from the path of the tool holding block 83 as it is being lowered. The lowered bonding toll 86 effects an electrical connection between the aligned inner lead portion IL and the bump b.

In this operation, as the air cylinder 81 is extended, the buffer tension spring 91 is gradually extended and it serves to provide a counterforce to the motion of the extended portion of the air cylinder 81. Since the counterforce is in proportion to the change of extension of the air cylinder 82, the speed of lowering of the bonding tool 86 is gradually decreased, whereby the bonding tool 86 will not shake the IC chip m.

After a prescribed time period from the time when the air cylinder 81 has reached the protruded stroke end, the air cylinder 81 i retracted and the bonding tool 86 is elevated. Simultaneously, the negative pressure applied on the suction opening 77 of the bonding stage 17 is removed, and the attracting force holding the IC chip m by the bonding stage 17 is released.

After the IC chip m is released, the Z direction stepping motor 70 is driven in the reverse direction, and the bonding stage 17 is lowered. The link mechanism operates in the reverse direction in association with the elevation of the bonding stage 86, and the reflection mirror unit 97 is returned to the original position.

Thereafter, when the elevating air cylinder 33 is protruded in the lead frame conveying unit A, the tapered pin 40 is elevated as shown by a dotted arrow of FIG. 14I. Consequently, the tapered portion 40a of the tapered pin 40 is engaged with the prescribed perforation P at the lead frame portion $LF_U$ which comprises the next object to be bonded.

Through the above described the steps, 1 cycle of bonding of a unit lead frame portion $LF_U$ is completed. The same operation above is then repeated for other units.

By the virtue of the above described structure, the inner lead portion IL of the unit lead frame portion $LF_U$ fed to the bonding position BP will not be shifted even when tapered pins are removed from the perforations.

In the foregoing, embodiment a tension spring 53 has been provided to assist the pressing operation. If however the unit comprising the weight holding frame 44, the lead frame weight 48, the cam follower 49 and the like is made heavy, the effect provided by the tension spring 53 can be without the tension spring 53.

The shifting of the lead frame LF is caused when the tapered pins 40 are retracted at the bonding position BP mainly from the friction between the tapered portions 40a and the perforations P. Therefore, this shifting can be prevented when the tapered portion 40a is formed of a material having a very small coefficient of friction. In that case, the unit comprising the weight holding frame 44, the lead frame weight 48, the cam follower 49 and so on may be omitted.

Even if there is shifting, the bump b of the IC chip can be aligned with the inner lead portion IL since the bonding stage 17 can be finely adjusted in the X and Y directions. Therefore, the above described unit of the lead frame weight 48 may be omitted when slight shifting generated when the tapered pins 40 are retracted is not regarded as a serious problem.

Figure 16A:
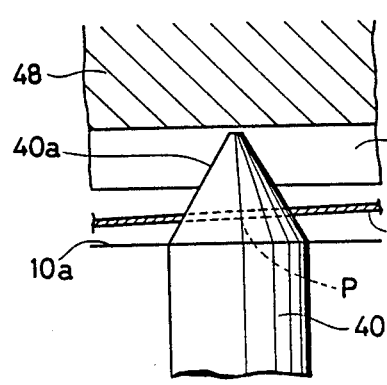
FIG. 16A is a front view showing a main portion of the lead frame conveying apparatus in accordance with another embodiment and FIG. 16B is a side view showing a main portion of the lead frame conveying apparatus in accordance with another embodiment.
Figure 16B:
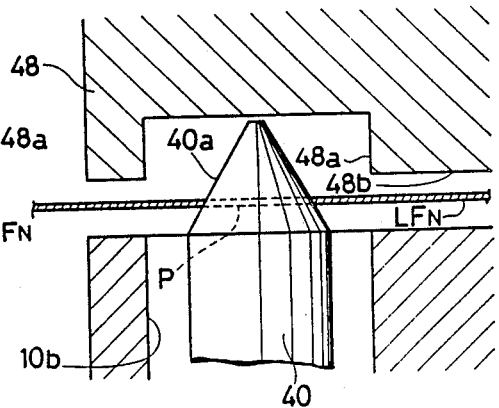

FIGS. 16A and 16B are cross sectional views showing a main portion of another embodiment of the present invention. A groove 48a along the X direction is formed on the lower surface of the lead frame weight 48, and it is moved with the inner portion of the tapered portion 40a contained in the groove 48a. Since the pressing surface 48b of the lead frame weight 48 is nearer to the guiding surface 10a of the guide rail 10 than in the above described embodiment, the speed of operation for holding the lead frame portion $LF_N$ by the lead frame weight 48 and the guiding surface 10a becomes faster. In addition, the shifting of the lead frame portion $LF_N$ can be more certainly prevented when the tapered portions 40a are extracted.

Except for the foregoing, the structure and operation of this embodiment is the same as the preceding one, so that the description thereof will be omitted.

Figure 17A:
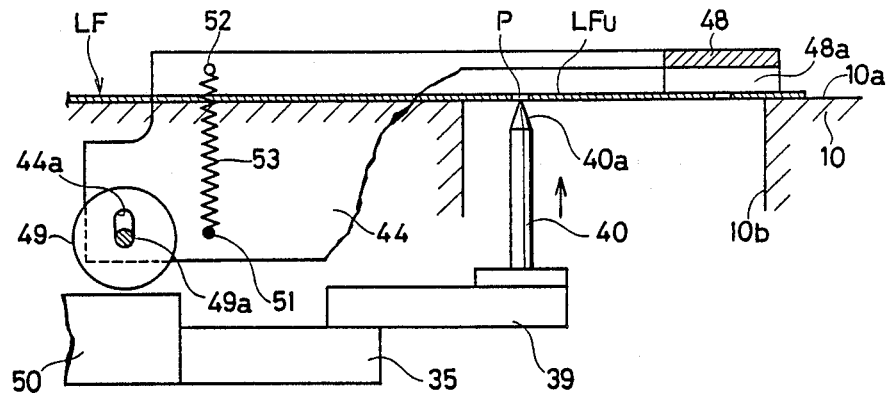
FIGS. 17A to 17C illustrate the operation of another embodiment of the present invention.
Figure 17B:
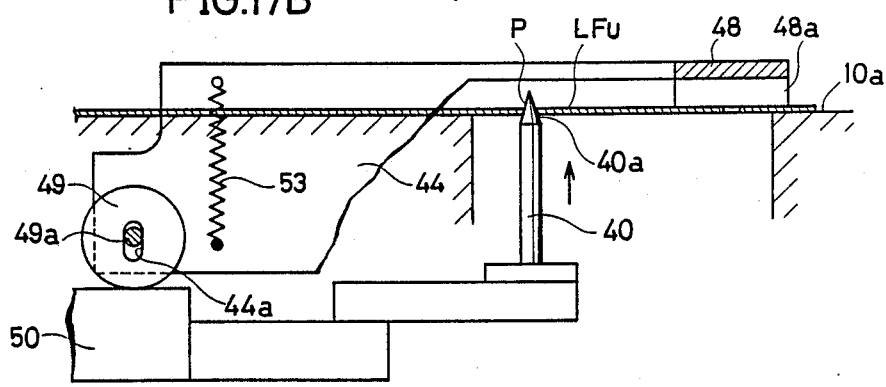
Figure 17C:
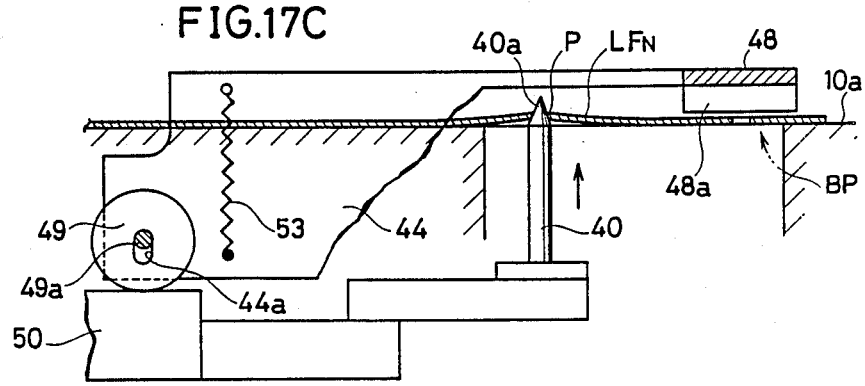

FIGS. 17A to 17C illustrate operation of a further embodiment of the present invention.

In the above described embodiments, in order to adjust the vertical position of the cam follower 49 in association with the weight holding frame 44, the axis portion of the cam follower 49 is passed through the elliptical hole 44a in the longitudinal direction, and the axis is fixed by fastening the nut after the position has been adjusted.

In the embodiment shown in FIGS. 17A to 17C, the axis portion 49a of the cam follower 49 is always movably supported in the vertically directed elliptical hole 44a. In addition, as in the embodiment of FIG. 16, a groove 48a is formed on the lower surface of the lead frame weight 48. Therefore, when the tapered pin 40 is elevated, both end portions of the lead frame LF are sandwiched by the lead frame weight 48 and the guiding surface 10a of the guide rail 10 until the tapered portion 40c is surely inserted into the perforation P (FIG. 17B). During that period, the guiding plate 50 as well as the tapered pins are elevated, and even when the guiding plate 50 is brought into contact with the cam follower 49, only the cam follower 49 is elevated and the weight holding frame 44 itself is not elevated. When the tapered portion 40a is surely inserted into the perforation P (FIG. 17C), the axis portion of the cam follower 49 is brought into contact with the upper end of the elliptical hole 44a so as to elevate the weight holding frame 44 together with the guiding plate 50, whereby the lead frame weight 48 is separated from the lead frame LF. In other words, this structure provides a time lag between the start of elevation of the tapered pins 40 and the start of elevation of the lead frame weight 48.

The process of elevation of the tapered pin 40 will be described in detail as follows. First, as shown in FIG. 17A, at the start of the elevation process, the guide plate 50 which is integral with the feed plate 35 is not yet in contact with the lower surface of the cam follower 49 when the upper end of the tapered portion 40a reaches the same height as the guiding surface 10a of the guide rail 10. At that time, the axis portion 49a of the cam follower 49 is in contact with the lower end portion of the elliptical hole 44a, due to the gravity. Therefore, the weight holding frame 44 is forced downward by the tension exerted by the spring 53, and therefore the lead frame weight 48 integral with the weight holding frame 44 is kept in a state where it presses both side end portions of the lead frame LF which is in contact with the guiding surface 10a. When the guide plate 50 is elevated a little from the position thereof in FIG. 17A, the guide plate 50 is brought into contact with the lower surface of the cam follower 49, so that the cam follower 49 is lifted as shown in FIG. 17B. However, at this time, only the axis portion 49a is elevated in the elliptical hole 44a, and the weight holding frame 44 is not lifted. In other words, the axis portion 49a of the cam follower 49 is not yet in contact with the upper end portion of the elliptical hole 44a. At this time, about a half of the tapered portion 40a is projecting above the guiding surface 10a of the guide rail 10 and about a half of the tapered portion 40a is inserted into the perforation P of the unit lead frame $LF_U$ which is the object of the next bonding. In this stage, there is a gap between the tapered portion 40a and the perforation P. Meanwhile, the lead frame 48 is kept pressing both side end portions of the lead frame LF by the force of the tension spring 53. In other words, it is in the state directly before separation from the lead frame LF. The tapered portion 40a is inserted into the perforation P with the lead frame LF pressed by the lead frame weight 48 onto the guiding surface 10a so as to prevent shifting of the lead frame LF as described above. Therefore, the tapered portion is surely inserted into the perforation. In a structure in which the delay of elevation of the cam follower 49 by means of the elliptical hole 44a is not provided, the lead frame weight 48 is separated apart from the lead frame LF before the tapered portion 40a enters the perforation P. In that case, the lead frame LF which is sandwiched is shifted due to the separating operation of the lead frame weight 48 or due to the vibration of the bonding apparatus. The position of the perforation P is shifted from the position of the tapered portion 40a, the elevated tapered portion 40a does not enter the perforation P but raises the lead frame portion $LF_N$ near the perforation P instead. Consequently, the engagement of the tapered portion 40a with the perforation P may possibly go wrong and, therefore the conveyance of the lead frame LF may possibly be unsuccessful. Since the present invention employs a structure in which the elevation of the cam follower 49 in the elliptical hole 44a is delayed, the above described problem does not occur.

When the tapered pin 40 is further elevated as shown in FIG. 17C, the axis portion 49a of the cam follower 49 is brought into contact with the upper end portion of the elliptical hole 44a to elevate the weight holding frame 44. Accordingly, the lead frame weight 48 is also elevated and separated from the lead frame LF on the guiding surface 10a. At that time, the tapered portion 40a is further elevated and is further inserted into the perforation P. However, since the largest diameter of the tapered portion 40a is larger than the diameter of the perforation P, the tapered portion 40a becomes engaged with the edge of the perforation P, whereby the lead frame $LF_N$ near the perforation P is raised from the guiding surface 10a of the height of the guide rail 10. Although the raised lead frame $LF_N$ tends to lower it, the lead frame $LF_N$ is still received by the tapered portion 40a, whereby the perforation P is automatically centered by the action of the tapered portion 40a.

Meanwhile, since the lead frame weight 48 is separated from the guiding surface 10a, feeding of the succeeding lead frames LF is not obstructed. In the above described structure, the upper end portion of the tapered portion 40a is positioned higher than the pressing surface 48b of the lead frame weight 48 in the position illustrated in FIG. 17C. However, there is no obstruction in the path when the tapered portion 40a is moved to the bonding position BP, on account of the groove 48a.

In the embodiment shown in FIGS. 17A to 17C, the rest of the structure and operation is the same as those in the above described embodiments, and the description thereof is, therefore omitted. In each of the above described embodiments, the largest diameter $\phi_1$ of the tapered portion 40a was equal to the diameter of the tapered pin 40. However, the largest diameter $\phi_1$ may be larger than the diameter of the tapered pin 40.

Although the lead frame conveying apparatus of the present invention is very useful in conveying thin lead frames, it may be applied to relatively thick lead frames. The present invention may be applied to lead frames on which the bumps b are formed not on the side of the IC chips m but on the inner lead portion IL.

As described above, according to the present invention, a tapered pin having an edge portion whose diameter is smaller than the diameter of a positioning perforation of the lead frame and a portion whose diameter is larger than the perforation supports the edge portion of the perforation so that the lead frame is conveyed to a bonding position. The tapered pin is inserted into the perforation of the lead frame from the axial direction of the pin. When the lead frame is raised it gravitates down by its own weight. Consequently, the center of the perforation becomes automatically aligned with the axial center of the tapered pin. Therefore, the positioning can be easily carried out in the lead frame conveying apparatus.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A lead frame conveying apparatus for conveying a lead frame to a bonding position, the lead frame having a positioning hole of a first dimension, the conveying apparatus comprising:

lead frame mounting means for mounting the lead frame to the conveying apparatus;

transverse conveying means disposed below said lead frame mounting means and having a projectable portion which can be inserted into the lead frame positioning hole for conveying the lead frame toward the bonding position in a transverse direction by moving said projectable portion in the transverse direction, said projectable portion including a tapered portion at an upper end thereof, said tapered portion including a largest portion having a second dimension larger than said first dimension of said positioning hole; and elevating means coupled to said transverse conveying means for elevating said projectable portion upward at a first position along said transverse direction and for lowering said projectable portion downward at a second position along said transverse direction in a manner which, upon insertion of said projectile portion into said lead frame positioning hole and conveying said projectable portion to and from said first and second positions, will cause at least a portion of said lead frame to be raised from said lead frame mounting means and to be lowered on said lead frame mounting means at the bonding position.

2. A lead frame conveying apparatus according to claim 1, wherein said projectable portion comprises a plurality of bar members, each of said bar members at an upper end thereof including tapering pins, each of said pins having a lower portion with said second dimension, said plurality of bar members being arranged in a longitudinal direction which intersects said transverse direction and said vertical direction.

3. A lead frame conveying apparatus according to claim 2, further comprising lead frame holding means for holding the lead frame when the lead frame is mounted on said lead frame mounting means.

4. A lead frame conveying apparatus for conveying a lead frame to a bonding position, the lead frame having a positioning hole of a first dimension, the conveying apparatus comprising:

lead frame mounting means for mounting the lead frame to the conveying apparatus;

transverse conveying means disposed below said lead frame mounting means and having a projectable portion which can be inserted into the lead frame positioning hole for conveying the lead frame in a transverse direction by moving said projectable portion in the transverse direction, said projectable portion including an upper portion having a second dimension which is smaller than said first dimension and a lower portion having a third dimension which is larger than said first dimension; and elevating means coupled to said transverse conveying means for moving said transverse conveying means in a vertical direction intersecting said transverse direction and in a manner which, upon insertion of said projectable portion into said lead frame positioning hole, will cause at least a portion of said lead frame to be raised from said lead frame mounting means;

said projectable portion comprising a plurality of bar members each of which has said upper portion with said second dimension and said lower portion with said third dimension, said plurality of bar members being arranged in a longitudinal direction which intersects said transverse direction and said vertical direction;

lead frame holding means for holding the lead frame when the lead frame is mounted on said lead frame mounting means; and said lead frame holding means comprising a lead frame weight means for pressing said lead frame from above.

5. A lead frame conveying apparatus according to claim 4, wherein said lead frame holding means further comprises lead frame forcing means for forcing said lead frame weight means in a direction to press said lead frame mounting means on the lead frame.

6. A lead frame conveying apparatus according to claim 5, wherein said forcing means comprises a spring.

7. A lead frame conveying apparatus for conveying a lead frame to a bonding position, the lead frame having a positioning hole of a first dimension, the conveying apparatus comprising:

lead frame mounting means for mounting the lead frame to the conveying apparatus;

transverse conveying means disposed below said lead frame mounting means and having a projectable portion which can be inserted into the lead frame positioning hole for conveying the lead frame in a transverse direction by moving said projectable portion in the transverse direction, said projectable portion including an upper portion having a second dimension which is smaller than said first dimension and a lower portion having a third dimension which is larger than said first dimension; and elevating means coupled to said transverse conveying means for moving said transverse conveying means in a vertical direction intersecting said transverse direction and in a manner which, upon insertion of said projectable portion into said lead frame positioning hole, will cause at least a portion of said lead frame to be raised from said lead frame mounting means;

said projectable portion comprising a plurality of bar members each of which has said upper portion with said second dimension and said lower portion with said third dimension, said plurality of bar members being arranged in a longitudinal direction which intersects said transverse direction and said vertical direction;

said elevating means being effective for elevating said plurality of bar members upward at a first position along said transverse direction and for lowering said bar members downward at a second position along said transverse direction; and said transverse conveying means being effective for conveying the lead frame to and from said first and second positions.

8. A lead frame conveying apparatus according to claim 7, wherein a position corresponding to said bonding position is selected as said second position.

9. A lead frame conveying apparatus according to claim 4, wherein said lead frame weight means comprises a groove of a prescribed depth formed on a side of said lead frame weight means facing said lead frame mounting means at a position which is opposed to said bar members.

10. A lead frame conveying apparatus according to claim 9, wherein said prescribed depth is deep enough to prevent an upper portion of said projectable portion from contacting said lead frame weight means when said lead frame weight means presses the lead frame on said lead frame mounting means and said projectable portion is inserted in said positioning hole at said first position.

11. A lead frame conveying apparatus according to claim 10, wherein said lead frame weight means is movable over a prescribed range in said vertical direction.

12. A lead frame conveying apparatus according to claim 11, wherein said prescribed range is adjustable.

13. A lead frame conveying apparatus according to claim 12, wherein said preselected range is selected so as to be large enough to allow the upper portion of said projectable portion to be inserted into said positioning hole when said lead frame weight means pressed the lead frame on said lead frame mounting means.

14. A lead frame conveying apparatus for conveying a lead frame to a bonding position, the lead frame having a positioning hole of a first dimension, the conveying apparatus comprising:

lead frame mounting means for mounting the lead frame to the conveying apparatus;

transverse conveying means disposed below said lead frame mounting means and having a projectable portion which can be inserted into the lead frame positioning hole for conveying the lead frame in a transverse direction by moving said projectable portion in the transverse direction, said projectable portion including an upper portion having a second dimension which is smaller than said first dimension and a lower portion having a third dimension which is larger than said first dimension; and elevating means coupled to said transverse conveying means for moving said transverse conveying means in a vertical direction intersecting said transverse direction and in a manner which, upon insertion of said projectable portion into said lead frame positioning hole, will cause at least a portion of said lead frame to be raised from said lead frame mounting means;

said projectable portion comprising a plurality of bar members each of which has said upper portion with said second dimension and said lower portion with said third dimension, said plurality of bar members being arranged in a longitudinal direction which intersects said transverse direction and said vertical direction;

said plurality of bar members being formed of a material which has a small coefficient of friction.

15. A lead frame conveying apparatus according to claim 3, wherein said lead frame holding means comprises a lead frame weight means for pressing said lead frame from above.

16. A lead frame conveying apparatus according to claim 15, wherein said lead frame holding means further comprises lead frame forcing means for forcing said lead frame weight means in a direction to press said lead frame mounting means on the lead frame.

17. A lead frame conveying apparatus according to claim 16, wherein said forcing means comprises a spring.

18. A lead frame conveying apparatus according to claim 2, wherein
a position corresponding to said bonding position is selected as said second position.

19. A lead frame conveying apparatus according to claim 15, wherein
said lead frame weight means comprises a groove of a prescribed depth formed on a side of said lead frame weight means facing said lead frame mounting means at a position which is opposed to said bar members.

20. A lead frame conveying apparatus according to claim 19, wherein said prescribed depth is deep enough to prevent an upper portion of said projectable portion from contacting said lead frame weight means when said lead frame weight means presses the lead frame on said lead frame mounting means and said projectable portion is inserted in said positioning hole at said first position.

21. A lead frame conveying apparatus according to claim 20, wherein
said lead frame weight means is movable over a prescribed range in said vertical direction.

22. A lead frame conveying apparatus according to claim 21, wherein
said prescribed range is adjustable.

23. A lead frame conveying apparatus according to claim 22, wherein
said prescribed range is selected so as to be large enough to allow the upper portion of said projectable portion to be inserted into said positioning hole when said lead frame weight means presses the lead frame on said lead frame mounting means.

24. A lead frame conveying apparatus according to claim 2, wherein said plurality of bar members are formed of a material which has a small coefficient of friction.

* * * * *